United States Patent
Stallwitz et al.

(10) Patent No.: US 9,787,042 B2
(45) Date of Patent: Oct. 10, 2017

(54) PROCESSING STATION AND METHOD FOR THE AUTOMATED MANUFACTURE OF CABLE HARNESSES AND PROCESSING UNIT FOR SUCH A PROCESSING STATION

(71) Applicant: LEONI BORDNETZ-SYSTEME GMBH, Kitzingen (DE)

(72) Inventors: Markus Stallwitz, Rednitzhembach (DE); Christian Dreyer, Niederwoerresbach (DE); Daniel Reiter, Wuerzburg (DE)

(73) Assignee: LEONI Bordnetz-Systeme GmbH, Kitzingen (DE)

( * ) Notice: Subject to any disclaimer, the term of this patent is extended or adjusted under 35 U.S.C. 154(b) by 884 days.

(21) Appl. No.: 14/017,863

(22) Filed: Sep. 4, 2013

(65) Prior Publication Data

US 2014/0013596 A1    Jan. 16, 2014

Related U.S. Application Data

(63) Continuation of application No. PCT/EP2011/003214, filed on Jun. 29, 2011.

(30) Foreign Application Priority Data

Mar. 4, 2011    (DE) .................. 10 2011 012 998

(51) Int. Cl.
*H01R 43/00* (2006.01)
*H01B 13/012* (2006.01)
(Continued)

(52) U.S. Cl.
CPC ....... *H01R 43/00* (2013.01); *H01B 13/01272* (2013.01); *H05K 13/065* (2013.01);
(Continued)

(58) Field of Classification Search
CPC .................. H01R 43/00; H01B 13/01272
(Continued)

(56) References Cited

U.S. PATENT DOCUMENTS 3,456,338 A * 7/1969 Avila ............... H02K 15/005
29/419.2
4,406,604 A * 9/1983 Imai .................. H01R 43/28
264/272.15
(Continued)

FOREIGN PATENT DOCUMENTS

DE    202007012534 U1    11/2007
DE    102008022337 A1    11/2009

OTHER PUBLICATIONS

International Search Report of PCT/EP2011/003214, Dated Nov. 16, 2011.

*Primary Examiner* — Peter DungBa Vo
*Assistant Examiner* — Jeffrey T Carley
(74) *Attorney, Agent, or Firm* — Laurence A. Greenberg; Werner H. Stemer; Ralph E. Locher

(57) ABSTRACT

A processing station automatically manufactures a cable harness containing a plurality of individual lines. The processing station has a support unit for holding a line bundle containing the individual lines with a predefined, even branched, routing, and a processing unit for the automated fixing of the individual lines of the line bundle to one another. The processing unit has a fixing unit, which is configured for the automated application of a fixing agent to the line bundle. A manipulator is provided for moving the processing unit relative to the line bundle.

6 Claims, 5 Drawing Sheets

(51) Int. Cl.
*H05K 13/06* (2006.01)
*H01B 13/00* (2006.01)

(52) U.S. Cl.
CPC ..... *H01B 13/0036* (2013.01); *Y10T 29/49117* (2015.01); *Y10T 29/53243* (2015.01)

(58) Field of Classification Search
USPC .......................................................... 29/749
See application file for complete search history.

(56) References Cited

U.S. PATENT DOCUMENTS

| | | |
|---|---|---|
| 5,851,288 A | 12/1998 | Garand et al. |
| 8,146,491 B2 | 4/2012 | Schaety et al. |
| 2010/0218369 A1 | 9/2010 | Selbach |

* cited by examiner

PROCESSING STATION AND METHOD FOR THE AUTOMATED MANUFACTURE OF CABLE HARNESSES AND PROCESSING UNIT FOR SUCH A PROCESSING STATION

CROSS-REFERENCE TO RELATED APPLICATION

This is a continuation application, under 35 U.S.C. §120, of copending international application No. PCT/EP2011/003214, filed Jun. 29, 2011, which designated the United States; this application also claims the priority, under 35 U.S.C. §119, of German patent application No. DE 10 2011 012 998.7, filed Mar. 4, 2011; the prior applications are herewith incorporated by reference in their entireties.

BACKGROUND OF THE INVENTION

Field of the Invention

The invention relates to a processing station and to a method for the automated manufacture of cable harnesses containing a plurality of individual lines. The invention also relates to a processing unit for a processing station of this type.

A cable harness is generally understood to be a pre-assembled line bundle, in which a plurality of individual lines are interconnected in accordance with a predefined routing or layout and in a defined length. Cable harnesses normally have a branched structure with a plurality of ramifications or junctions. The individual lines have a defined length and the cable harness is therefore on the whole a pre-fabricated, pre-assembled single item. Contact elements, such as plugs or the like, are often already attached onto the individual ends of the individual lines. Cable harnesses of this type are also used in particular in the automotive industry, for example for the electrical connection of a plurality of consumers to a central distributor unit or control unit.

A cable harness of this type is still manufactured manually in many fields. To this end, the individual lines necessary for the cable harness are first laid on what is known as an assembly or cable board in accordance with the defined and desired routing. Here, the individual lines are received by holders. The loose line bundle thus formed from the individual lines is then fixed by attaching a banding around the individual lines. This is carried out manually, for example using special self-adhesive bands.

There are different possibilities for the banding process, specifically what is known as full banding, in which the line bundle is surrounded completely by the banding, or also what is known as economy banding, in which the line bundle is surrounded only in some regions by the banding. In order to avoid rattling noises during subsequent use, special tapes or bandings, specifically what are known as fleece bands, are used. Depending on the place of use of the cable harness, the banding therefore has different functions. The primary function is the connection of the individual lines. In addition, the banding is often also used to fasten mounting elements or additional elements. Furthermore, the banding is used as mechanical protection, as rattle protection, etc. As required, the line bundle is surrounded at least in some regions by a foamed body, for example so as to form what is known as a dimensionally stable cable harness, in which the geometry of the junctions and ramifications is fixed. For foamed cable harnesses of this type, the line bundle is normally laid in a mold (foaming mold), into which a foamable material, for example a PU material, is then introduced.

Since these cable harnesses are not goods sold by the meter, that is to say endless goods, and the cable harnesses are additionally characterized by a large number of branches and ramifications, the attachment of such a banding is not automated to this day. A cable harness typically has specifically only very short straight portions without ramifications, which normally only measure in the range of up to a few tens of centimeters.

BRIEF SUMMARY OF THE INVENTION

It is accordingly an object of the invention to provide a processing station and a method for the automated manufacture of cable harnesses and a processing unit for such a processing station that overcome the above-mentioned disadvantages of the prior art devices and methods of this general type, which is to enable automated joining together of the individual lines to produce a cable harness.

With the foregoing and other objects in view there is provided, in accordance with the invention a processing station for automated manufacture of a cable harness containing a plurality of individual lines. The processing station contains a support unit for holding a line bundle containing the individual lines with a predefined, even branched, routing, and a processing unit for automated fixing of the individual lines of the line bundle to one another. The processing unit has a fixing unit configured for an automated application of a fixing agent onto the line bundle. A manipulator is provided for moving the processing unit relative to the line bundle.

The advantages discussed hereinafter, in particular the preferred developments of the individual features contained in the claims, are further preferred variants for achieving the object in accordance with the invention. The right to include these further preferred features and also any combinations thereof in the claims remains reserved. The discussed advantages and preferred embodiments can also each be transferred as expedient between the processing station, the method and the processing unit.

For the automated manufacture of the cable harnesses containing the individual lines, in particular for connection of the individual lines in the manner of a banding, a loose line bundle that is formed of the individual lines and that has a predefined and branched routing, normally with a large number of junctions and ramifications, is held by a support unit, that is to say is pre-fixed on the support unit. In this case, a loose line bundle is understood to mean the arrangement side by side of the individual lines in accordance with the intended routing, without banding or the like. The individual lines therefore lie loosely side by side, and at best are pre-fixed by retaining elements of the support unit. In the second step, the individual lines are fixed to one another in an automated manner with the aid of a processing unit in the manner of a banding. To this end, the processing unit has a fixing unit, which applies a fixing agent to the loose line bundle, such that the individual lines are interconnected by the fixing agent. The fixing agent therefore replaces the banding. To apply the fixing agent, the processing unit and the line bundle are moved relative to one another along the line bundle in a processing direction, preferably with the aid of a manipulator.

The support unit is preferably formed in the manner of a conventional assembly or cable board and, depending on the size of the cable harness, has an area of up to several m², on which the line bundle is laid in accordance with the intended routing, that is to say the intended branched and ramified geometry of the cable harness. The individual lines are normally insulated conductor cores made of a conductive material such as copper, aluminum or alloys thereof.

The support unit preferably has rod holders as holding elements for the line bundle, the rod holders forming, for example, a fork-shaped or half-ring-shaped receptacle at the end, the line bundle being inserted into the receptacle. The line bundle is therefore held at a distance from a plane, for example a plate-like support, such that it can be encompassed around its entire periphery by the processing unit.

Due to the replacement of the previously conventional banding by bands with the application of the fixing agent, for example with the aid of a spraying method or injection method, the individual lines can be fixed to one another in an automated manner in the form of a banding in a more economical and at the same time more reliable manner, such that, on the whole, a high degree of automation is achieved when fabricating the cable harness. There is thus no complex manual banding of the individual lines to one another. With this embodiment, both complete bandings and also what are known as spot bandings or economy bandings are enabled by a suitable control.

The manipulator is, for example, an actuator that can move the processing unit in the xyz direction and in particular additionally also allows rotation about the axis defined by the processing direction. The manipulator is preferably a robot arm of a multi-axis industrial robot, for example what is known as a 6-axis industrial robot. A large number of degrees of freedom are thus enabled. A high design freedom and high versatility is thus achieved, which is of particular advantage particularly with the different demands and embodiments or types of cable harnesses.

In order to perform the relative movement between the processing unit and the line bundle, the processing unit is preferably guided by a robot hand of a multi-axis industrial robot. Alternatively, it is also possible to guide the entire support unit and to leave the processing unit stationary.

The fixing agent preferably has a liquid or viscous consistency during the deposition process and cures once applied to the line bundle. The fixing agent can thus be applied reliably. Once cured, the fixing agent surrounds the line bundle, preferably in the manner of a band or a sheathing, and thus holds the individual lines together.

In accordance with a particularly advantageous embodiment, the processing unit is configured to encompass the line bundle, at least in part, such that the processing unit during the processing method can be advanced toward the line bundle in the radial direction. For this purpose, the processing unit preferably has at least two sub-arms, which are movable relative to one another and in the closed state encompass the individual lines, preferably completely in the manner of a ring. The two sub-arms are preferably displaceable relative to one another with the aid of an actuating element, for example a linear drive, or are also interconnected via a hinged connection. The two sub-arms can preferably be locked to one another via a closure formed in the manner of a bayonet closure.

Alternatively or additionally to the two-part embodiment, the processing unit is C-shaped or U-shaped, such that the line bundle can be introduced via the open region into the central space defined by the processing unit.

This embodiment allows an efficient, reliable application of the fixing agent, even with the complex cable harness geometries having a plurality of branches. In particular, obstacles such as those formed for example by the rod holders can thus also be taken into consideration by either bringing the opening in the fork-shaped processing unit into an appropriate orientation or by opening the two sub-arms slightly.

In a preferred embodiment, the two sub-arms are in this case formed symmetrically with respect to a parting plane and have the same component parts. In particular, each of the sub-arms here has the same component parts, in particular one or more fixing units and/or compressing units and/or curing units.

In accordance with an expedient development, a curable plastic resin is used as the fixing agent. In this case, the fixing agent may also be a two-component system. Curable resin systems are known in many fields. A suitable resin system which enables reliable processing on the one hand and which cures as quickly as possible after application, preferably immediately, on the other hand is preferably selected in order to enable the quickest processing speeds possible. In particular, a rate of travel of the processing unit relative to the line bundle of 100 mm per second is provided, that is to say the resin system must allow sufficiently quick curing. The curing process is preferably finished, at least to a large extent, as soon as the processing unit has travelled fully over the respective point of the line bundle. The resin therefore cures almost instantaneously immediately after being deposited onto the line bundle.

In accordance with a preferred embodiment, the use of a plurality of different fixing agents is additionally provided, such that, depending on requirements, different fixing agents can be used either with one line bundle or with different line bundles, without the need for tool replacement. The individual nozzles and any curing units are in this case preferably adapted to the respective resin system. In this variant, the processing station therefore contains a plurality of storage containers for the different fixing agents (different resin systems). A structuring of the applied fixing agent is generally preferably provided by applying flocking material, such as fibers or other solid particles. The desired properties, for example for scuff protection or sound protection, are thus suitably set. What are known as "fleece dispensers" can also be replicated as a result.

With a desirable thick material deposition, a number of layers are preferably deposited, wherein an alternating application of fixing agent and fiber material (flocking agent) is also provided here in particular.

In a preferred development, further component parts, such as clips or other fastening elements, are also fastened at the same time to the line bundle with the aid of the fixing agent, either to the individual lines or to plug connectors already attached. These component parts are in this case pre-fixed in the desired mounting position and are reliably fastened with the aid of the fixing agent.

In an expedient embodiment, resin or lacquer systems are used, which have a sufficient stiffness and hardness once cured, for example so as to form the entire line bundle in a dimensionally stable manner, at least in regions.

It is also possible to form component parts, such as clips or plug-in pins (to be plugged into drilled holes in a sheet metal component part for fastening) directly from the applied fixing agent.

For the metered application of the fixing agent, at least one nozzle or metering needle is expediently provided as a fixing unit or as part of the fixing unit. In an expedient development, a plurality of nozzles is provided in particular and are distributed in the peripheral direction, that is to say are arranged over a circle or an arc of a circle. Here, the nozzles preferably surround the line bundle, at least largely in an annular manner, during operation. As a result of this embodiment, it is possible to apply the fixing agent completely around the periphery in the manner of a banding. Alternatively or also additionally to the embodiment with a plurality of nozzles, which are arranged in a fixed manner, a rotatable mounting of the at least one nozzle is provided.

The nozzles are preferably controllable nozzles, which are opened and closed via control signals predefined by a control unit. This allows a very versatile application of the fixing agent with different deposition rates and in particular allows the application of the fixing agent in the manner of different banding types, for example complete banding or also economy banding, in which the fixing agent is deposited onto the line bundle helically. This is achieved for example by a successive control of the nozzles arranged in a distributed manner. Alternatively or additionally, this is achieved by a rotational movement of the at least one nozzle.

Due to the successive control or due to a rotation of the at least one nozzle about the line bundle, structured patterns of the fixing agent are applied in a preferred embodiment depending on requirements. Instead of a complete rotational movement, an oscillation over a restricted angular range, for example of up to 120° or up to 180°, is provided. For example, a net-like structure is thus formed as banding. Depending on the oscillation frequency and feed rate, a very close-meshed (up to complete covering of the surface) or a very wide-meshed structure can be formed here. The oscillation/rotation of the nozzles is alternatively also achieved in the manner of a quasi-rotation by the successive control of stationary nozzles.

On the whole, a plurality of nozzles is preferably provided and are arranged in the manner of an array, for example annularly or semi-annularly. For depositions over large areas, the nozzles are preferably formed as slit nozzles.

In accordance with a preferred variant, the nozzles are formed as piezo nozzles or piezo metering devices, and the fixing agent is therefore ejected with the aid of the piezoelectric effect.

In an expedient development, the processing unit as a whole is moved with the aid of the manipulator in the peripheral direction around the line bundle in order to perform the rotation.

Cable harnesses are generally characterized by very high diversity and high variability in terms of their complexity and size. In order to process a large number of different cable harness types with one processing unit, a controlled radial feed of the nozzles in the direction of a central axis is provided. As a result of this measure, the nozzle can therefore always be brought to an optimal distance from the line bundle. Here, the nozzle is preferably mounted on a rocker, such that the feed movement in the radial direction is performed with the aid of a pivoting motion. With the arrangement of a plurality of nozzles, a number of the nozzles are preferably coupled to one another via a common drive, such that the nozzles move synchronously.

With regard to a curing process that is as quick as possible, a curing unit is attached to the processing unit. The processing unit is therefore multifunctional on the whole and, besides the function of applying the fixing agent, also has the function of curing. Depending on the choice of curing system, different curing units can be provided in this case. In the case of UV-curing resin systems, a light source, in particular a UV light source, is provided in particular and irradiates the applied fixing agent. Here, each individual nozzle is preferably assigned its own curing unit or its own curing element, such as a light source.

Alternatively to the UV light source, a heat source is expediently arranged, for example an infrared radiation source. In a preferred variant, for an air-curing system, the curing unit is formed as a gas-flow unit, via which a gas at overpressure is conveyed in the direction of the applied fixing agent. Gas nozzles are expediently provided for this purpose. Alternatively to directed nozzles, for example concentrated in a single point, a large-area flow opening that extends at least over a sub-region of the periphery along the line of a circular arc is provided in an alternative embodiment. In particular, a ring nozzle is provided here to form an annular flow cover. In the case of such a gas-flow unit, a fan for generating the gas flow and/or a pressurized gas source is/are therefore also provided in particular. Alternatively, an attachment is made to a gas supply system.

In a particularly preferred embodiment, it is possible to switch over between two different gas types. At least two different gas supplies are preferably provided, between which it is possible to switch by a suitable control, for example with the aid of a switch-over valve. Some resin systems demonstrate different curing behavior depending on the selected gas, which is thus utilized expediently. For example, resin systems that remain tacky at their surface when exposed to oxygenous gas (air), but which form a tack-free surface under inert gas, for example nitrogen, are known. This is utilized for example if the surface of the fixing agent is to be provided with fibers/particles to produce a flocked finish.

The gas is expediently pressed against the fixing agent at a sufficient overpressure, for example of a few bar, such that the fixing agent also penetrates to some extent into the line bundle, such that a more intense connection of the individual lines is achieved.

The feed gas flow is expediently used alternatively or also additionally to structuring of the fixing agent, that is to say the applied fixing agent is shifted to a certain extent by the gas flow after application, such that regions of different material thickness are formed, for example. In particular, an oscillating, wave-like surface structure of the fixing agent can thus be formed. For example, a corrugated pipe property can thus be produced to a certain extent with radially protruding ribs.

This structuring with variable material thickness of the fixing agent can also generally be implemented without the gas feed unit.

For structuring purposes, a separate additional gas feed unit with an appropriate nozzle arrangement is provided besides the curing unit and is arranged upstream of the curing unit.

In accordance with a preferred development, a compression unit is provided, with the aid of which the individual lines are compressed before the application of the fixing agent and are pressed together to form a bundle having a defined diameter.

Here, the compression unit is formed in such a way that the individual lines are pressed together in the radial direction, preferably at least substantially concentrically with a mid-axis or central axis. Here, the compression unit preferably has individual compression elements, which are distributed over the periphery. The individual compression elements are formed for example as segments of a circular arc or as annular segments, which are movable in the radial direction, for example with the aid of a ram. In accordance with a preferred embodiment, the compression elements are shifted in the radial direction with the aid of a pivoting motion. They are therefore mounted pivotably at the edge on the processing unit. The drive is provided via a suitable, controllable drive unit. The compression elements are expediently formed as simple rods. The movements of the individual compression elements are matched to one another in order to achieve concentric compression.

Here, the compression unit is expediently part of the processing unit. The processing unit in particular has the following units: fixing unit and compression unit. As required and in an expedient development, the third function unit, specifically the curing unit, is also integrated in the processing unit.

On the whole, the processing unit is formed in the manner of a uniform tool head, which is moved along the line bundle. With just a single run over the line bundle with the aid of the processing unit, the individual lines are therefore first compressed, then the fixing agent is applied, and curing is then performed. Here, the individual function units follow one another directly. The processing unit generally has a support, on which (as considered in the processing direction) the compression unit, then the fixing unit and lastly the curing unit are arranged on the input side. A very compact embodiment is thus achieved on the whole, and high processing speeds are also enabled. The compact configuration allows simple handling, even with complex cable harness geometries. Due to the compact embodiment, the processing unit, that is to say the individual function units, can be guided very closely over the line bundle, even in the region of junctions.

To summarize, the processing unit, the processing station and the method are characterized in combination by the following functions/function units, which in particular, due to their cooperation, enable a reliable, automated fixing of the individual lines of a line bundle of a cable harness in the manner of a banding:
a) bundling/compression of the individual lines with the aid of the compression unit and holding together of the individual lines until the fixing agent is deposited (the compression unit is immediately upstream of the fixing unit (<5 cm),
b) application of the fixing agent with the aid of the fixing unit, wherein the fixing agent is a UV-curing resin system in particular,
c) optionally a structuring of the as yet uncured resin by a gas flow with the aid of the gas feed unit, and
d) curing of the resin by the curing unit.

All function units are integrated here within the processing unit formed in the manner of a tool head. The processing unit is formed here preferably to encompass the line bundle and in particular is formed from two sub-arms.

Other features which are considered as characteristic for the invention are set forth in the appended claims.

Although the invention is illustrated and described herein as embodied in a processing station and a method for the automated manufacture of cable harnesses and a processing unit for such a processing station, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 3A is a front view of the processing unit in accordance with the first variant;

DESCRIPTION OF THE INVENTION

Figure 1:
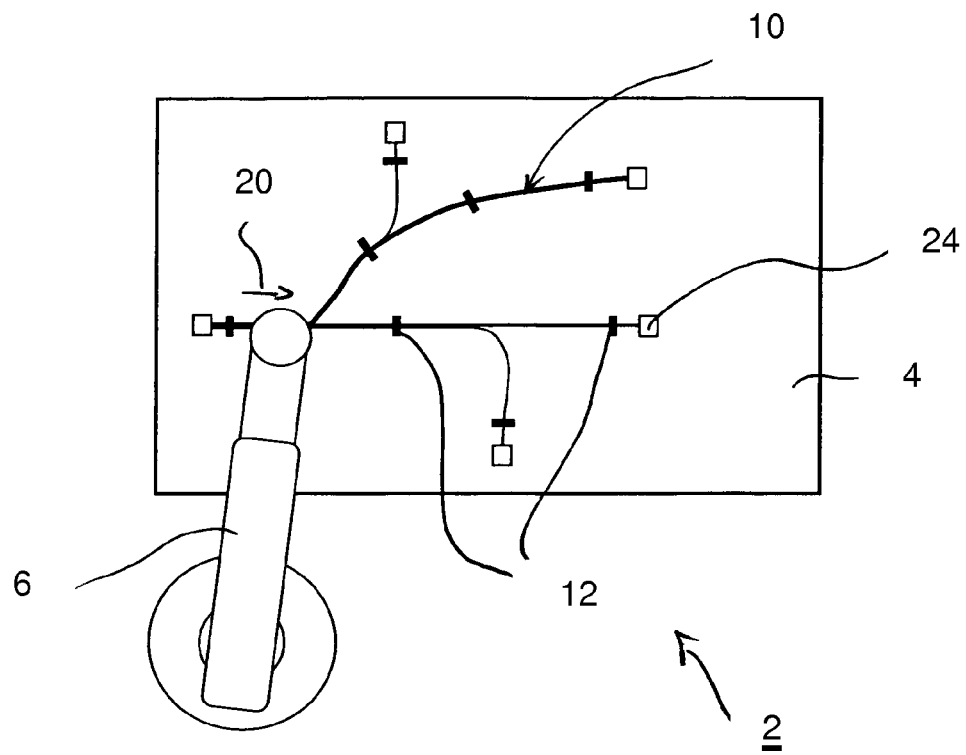
FIG. 1 is a basic schematic view of a processing station for an automated manufacture of a cable harness according to the invention.

In the figures, equivalent parts are provided with like reference signs.

The fundamental method for the automated manufacture of cable harnesses will first be explained in greater detail with reference to FIGS. 1 and 2. As can be seen with reference to FIG. 1, a processing station 2 contains a support unit 4 formed as a cable board, a manipulator 6, in the exemplary embodiment a multi-axis industrial robot, and also a processing unit 8 (FIG. 2), which is fastened to the manipulator 6, specifically to a robot hand.

The manipulator 6 has a number of degrees of freedom in order to move the processing unit 8 relative to the support unit 4 into any position. In particular, the manipulator 6 provides at least one rotary degree of freedom, such that the processing unit 8 can be rotated on the whole with the aid of the manipulator 6.

A branched line bundle 10 is fitted onto the support unit 4 on holding elements 12. Here, the line bundle 10 is formed from a plurality of individual lines 14 (FIG. 2). Each of the individual lines 14 is formed in the exemplary embodiment by an electrically conductive core surrounded by insulation. The holding elements 12 are formed in the manner of bar holders with a fork-shaped receptacle, in which the individual lines 14 lie. Due to the holding elements 12, the line bundle 10 is therefore distanced from the surface of an assembly board of the support unit 4. The line bundle 10 can thus be encompassed by the processing unit 8.

Figure 2:
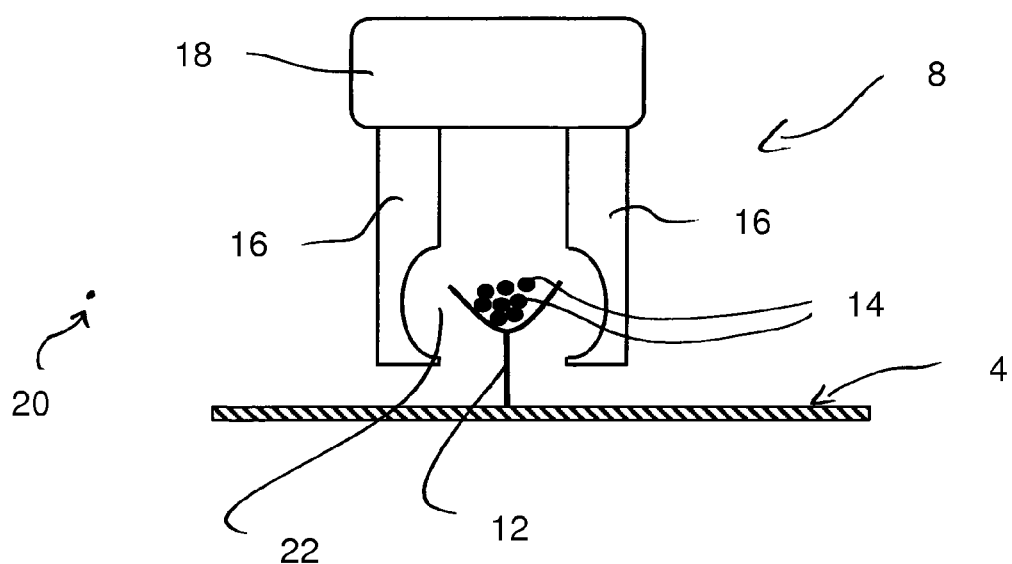
FIG. 2 is a highly simplified and schematic illustration from the side of a processing unit and a support unit.

As already illustrated in FIG. 2, the processing unit 8 has two sub-arms 16, which in the exemplary embodiment can be moved relative to one another and perpendicular to a processing direction 20 with the aid of a (linear) actuator 18. In the closed state, the two sub-arms 16 define a circular central space 22, in which the line bundle 10 lies. The processing direction 20 is generally defined by the direction in which the processing unit 8 is moved relative to the line bundle 10. In the case of junctions, the processing direction 20 therefore changes.

In the case of the line bundle 10, the individual lines 14 are initially only held loosely against one another. With the aid of the processing unit 8, a curable resin in liquid or viscous form is applied as a fixing agent onto the line bundle 10 successively in the processing direction 20. At the end of this treatment, the individual lines 14 are therefore fixed to one another. The line bundle 10 with the individual lines 14, which are then fixed, forms the finished cable harness.

As can be deduced from FIG. 1, contact elements 24 are attached to each of the ends of the cable harness in the exemplary embodiment. The line bundle 10 has a plurality of branches. Due to these branches, it was not previously possible to automate the previously conventional banding of the line bundle 10 in an economically viable manner.

Due to the specific embodiment of the processing unit 8 and the fundamentally novel concept of applying a fixing agent which cures after the application process and fixes the individual lines 14 in the manner of a banding, automated manufacture is now made possible in an economically feasible manner. A specific consideration here is the basic concept that the processing unit 8 approaches the line bundle 10 radially, that is to say perpendicular to the processing direction 20, and can encompass the line bundle. This is enabled in the exemplary embodiment by the adjustable sub-arms 16. As soon as a branch point or another obstacle, such as a holding element 12, is encountered, the sub-arms 16 are opened and the processing unit 8 is moved away over the branch point or the obstacle so as to then continue with the application of the fixing agent with closed sub-arms 16. The manipulator 6 and the processing unit 8 are controlled with the aid of a non-illustrated control unit.

Alternatively to the embodiment with the two sub-arms 16, a U-shaped or C-shaped embodiment of the processing unit 8 is also possible. In this case, it is not absolutely necessary to withdraw the processing unit 8 when obstacles or branches of the line bundle 10 are encountered. Rather, a suitable rotation the processing unit 8 with the aid of the manipulator 6 is sufficient. The individual branches of the branched line set 10 are provided in succession with the fixing agent in the manner of a banding as required.

During operation, the processing unit 8 is moved along the line bundle 10 in the processing direction 20. Here, by the processing unit 8, the individual lines 14 are firstly compressed, the fixing agent is deposited, the fixing agent is structured where appropriate, and the fixing agent is cured. The rate of travel here is preferably a few cm/second up to approximately 10 cm/second, at least in regions without obstacles.

Exemplary embodiments for a specific structure of the processing unit 8 will be explained in greater detail hereinafter with reference to FIGS. 3A to 5B.

In all three variants, two sub-arms 16 are provided, which can be adjusted linearly in relation to one another and which each contain a pillar-like supporting element, at the ends of which a semi-annular processing head is arranged. The two semi-annular processing heads in the closed state of the sub-arms 16 form a closed tool head, which surrounds a central space 22 in its interior. The term "semi-annular or annular" in conjunction with the tool head is to be understood broadly in this case and also contains the variants in FIGS. 3A to 5B, that is to say is not necessarily limited to a circular cross-sectional geometry of the tool head.

In all three variants, two function units are integrated in the tool head, specifically an input-side compression unit 26 and an adjoining fixing unit 28. In the variant according to FIGS. 5A-5B, a curing unit 30 adjoining the fixing unit 28 is additionally provided, these units being integrated in a common module in this exemplary embodiment.

The compression unit 26 is formed identically in all three variants and has a plurality of compression elements 32 arranged peripherally relative to the central space 22. Four compression elements are provided in the exemplary embodiment. These are formed in this case by rods which are rotatably mounted at their end face and can be pivoted into the central space 22 in a motor-driven manner. Since the individual rods cross, the line bundle 10 lying in the central space 22 is compressed when the rods are pivoted toward the central space 22, and are further bundled. To pivot the rods, a drive mechanism (not illustrated here in greater detail) is provided, which, at the end via a toothing between two adjacent compression elements 32, provides a synchronous movement that is transmitted to both of the compression elements 32 in each case, as can be clearly seen in FIGS. 4A and 5A.

Figure 3A:
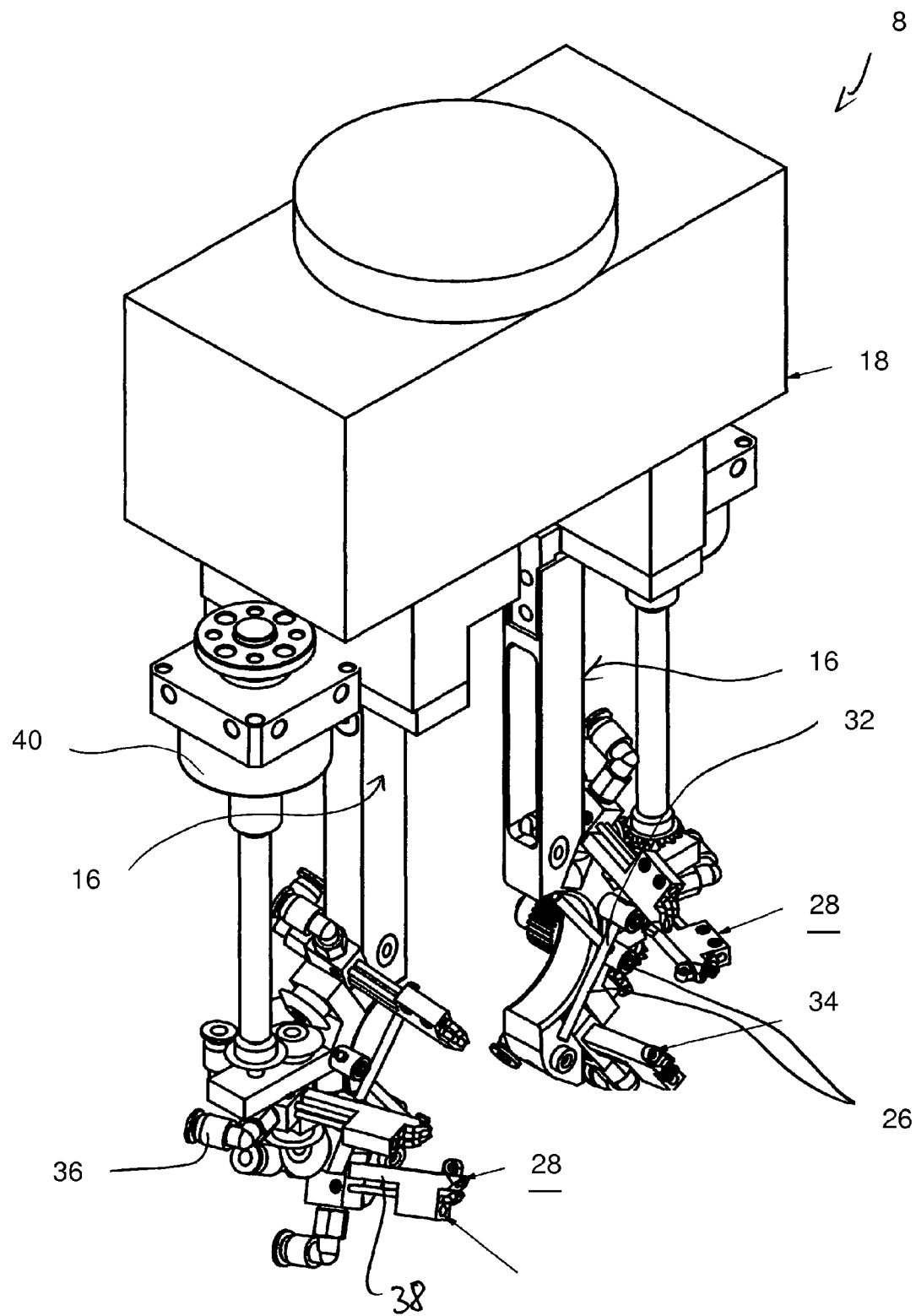
FIG. 3A is a perspective view of the processing unit, illustrated partly in a simplified manner, in accordance with a first variant.

Each of the fixing units 28 contains a nozzle 34, via which the fixing agent escapes. The fixing agent is fed via suitable feeds to the individual fixing units 28. In FIG. 3A, line connections 36 are provided for the connection of feed tubes for the fixing agent, which is liquid in the starting state.

Figure 3B:
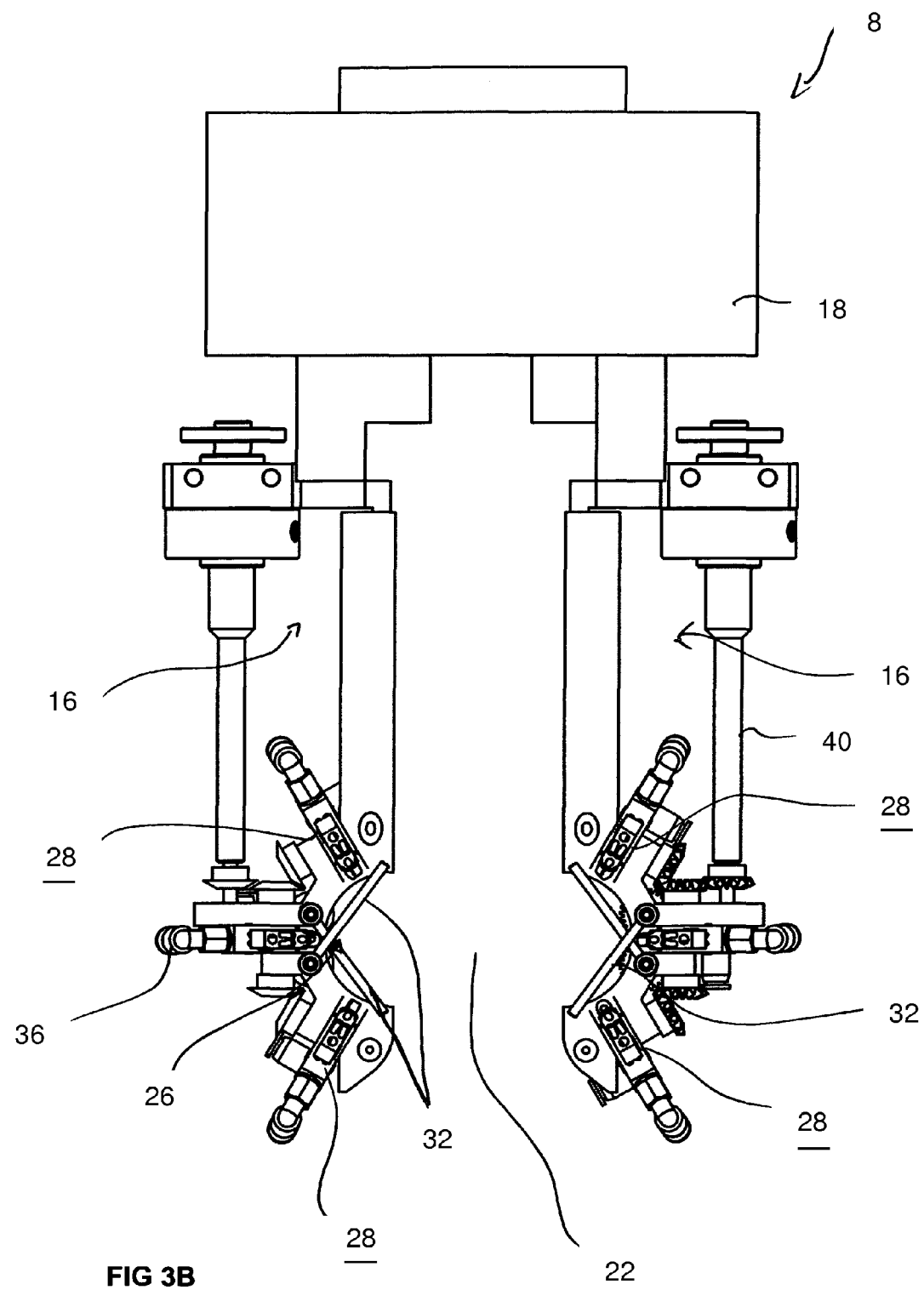

In the exemplary embodiment in FIGS. 3A-3B, the nozzles 34 are arranged on the end of pivotably mounted arms 38. The line connections 36 are provided on the rear face of the arms 38. The arms 38 are pivoted with the aid of an actuating drive 40, wherein each sub-arm 16 is provided with its own actuating drive 40, the actuating drives being synchronized with one another however. In the exemplary embodiment, the actuating movement is transmitted from the actuating drive 40 via a drive shaft and a type of gearing to the individual arms 38 in order to perform the pivoting movement.

Figure 4A:
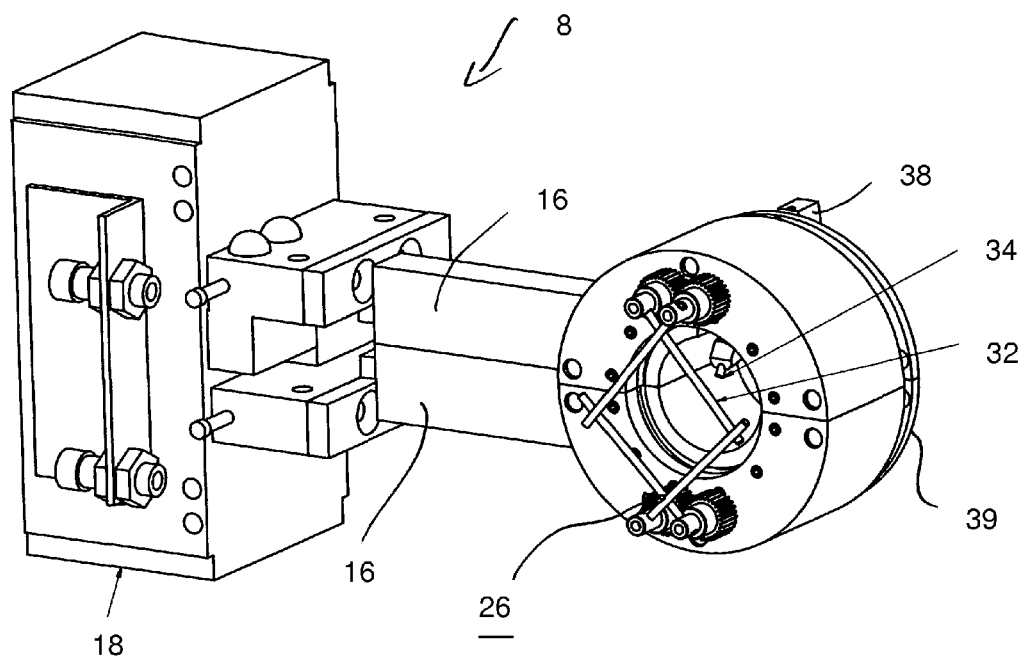
FIG. 4A is a perspective front view in a partly simplified illustration in accordance with a second variant of the processing unit.
Figure 4B:
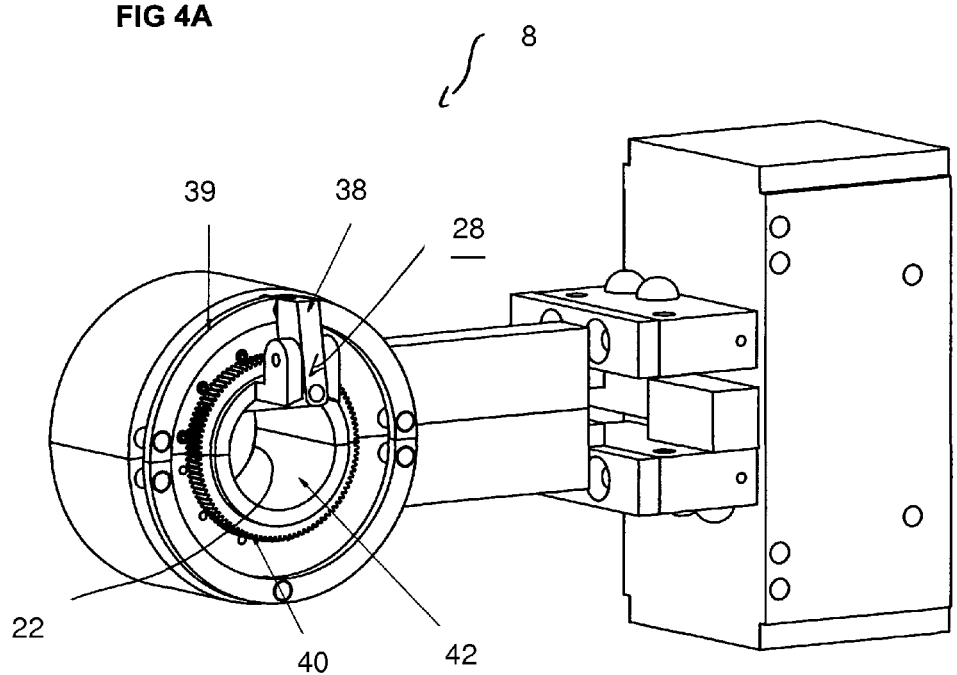
FIG. 4B is a perspective rear view in accordance with the second variant.

In the exemplary embodiment in FIGS. 4A-4B, merely a single fixing unit 28 with merely one pivotable arm 38 is provided, the arm 38 being formed in this case in the manner of a pivoted or hinged lever. To adjust the arm 38, a ring element 39 is provided in the exemplary embodiment and is adjustable in the axial direction and thus acts on the hinged lever in order to produce the desired adjustment.

In the variant illustrated in FIG. 4A-4B, the arm 38 is arranged rotatably about the central space 22. In the exemplary embodiment, this is enabled by an inner rotor 42 and also a drive ring gear 44. Due to a gearwheel (not illustrated here in greater detail), which is connected to the arm 38 and meshes with the drive ring gear 44, a rotation of the arm 38 fastened to the inner rotor 42 about the central space 22 is enabled. Due to the sub-arms 16, both the inner rotor 42 and the drive ring gear 44 are formed in two parts.

Figure 5A:
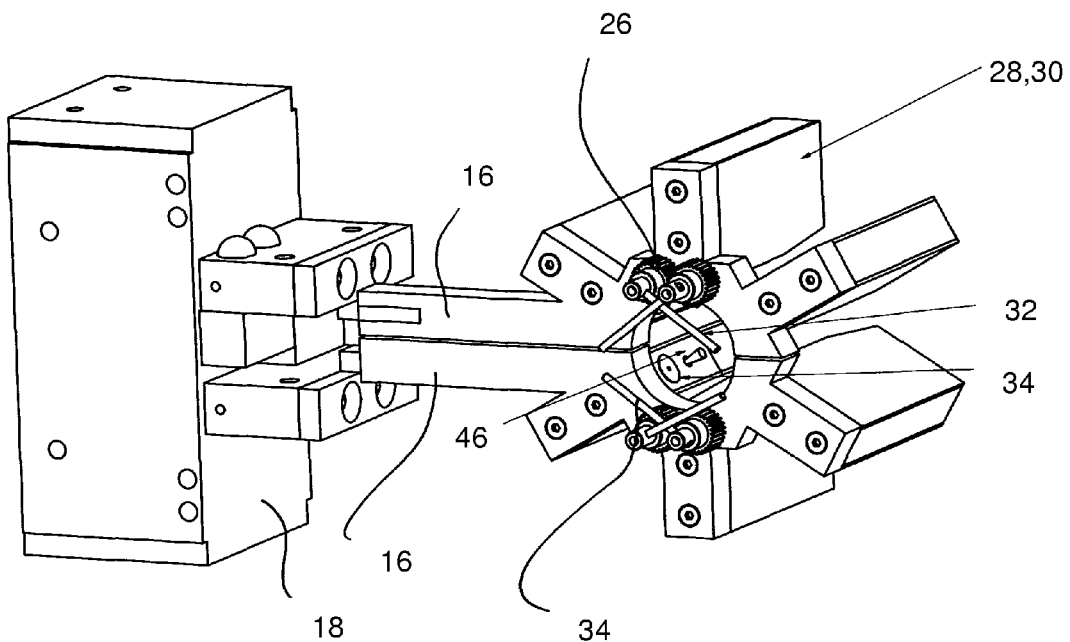
FIG. 5A is a perspective front view in a partly simplified illustration of a third variant of the processing unit.
Figure 5B:
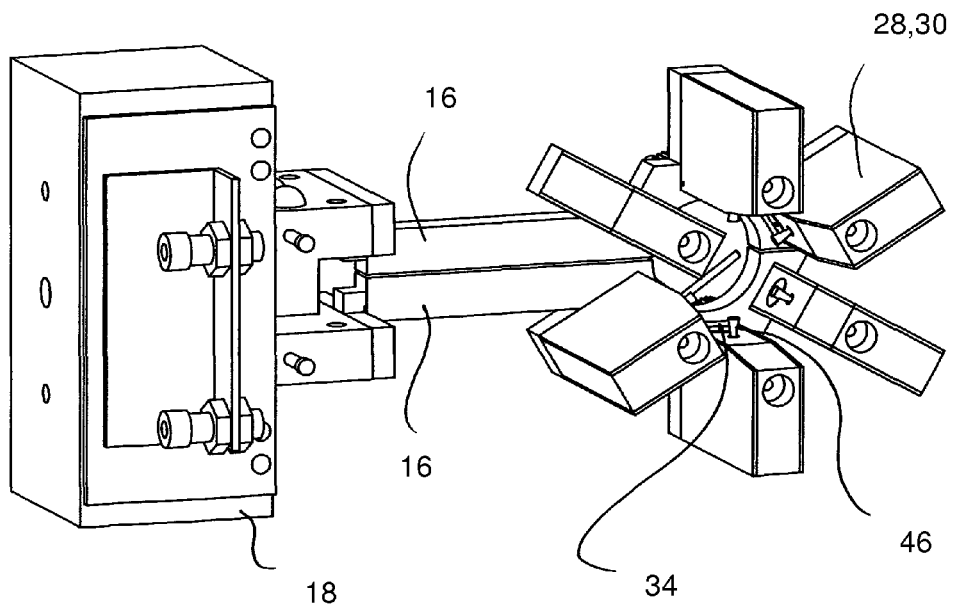
FIG. 5B is a perspective rear view of the third variant of the processing unit.

In the variant according to FIGS. 5A-5B, a plurality of module units is arranged in an approximately star-shaped manner on the tool head. Here, the module units are each fastened by screws to a star-shaped mounting plate. Each of the module units has, as a component, a fixing unit 28 with a nozzle 34. The module units are piezo units in particular, and the nozzles 34 are therefore formed as piezo nozzles, that is to say the fixing agent is ejected from the nozzles 34 with the aid of the piezoelectric effect in a manner known per se.

The curing unit 30 is also additionally integrated into the respective module unit and is formed in this exemplary embodiment by UV light sources 46. These are arranged so as to follow the nozzles 34 against the processing direction 20.

The invention claimed is:

1. A processing station for automated manufacture of a cable harness containing a plurality of individual lines, the processing station comprising:
   a support unit for holding a loose line bundle containing the individual lines with a predefined, even branched, routing;
   a processing unit for automated fixing of the individual lines of the loose line bundle to one another, said processing unit having a fixing unit configured for an automated application of a fixing agent onto the loose line bundle in a manner of a banding resulting in a line bundle, the fixing agent being a curable resin, said processing unit having a compression unit for compressing the individual lines and a tool head, said compression unit and said fixing unit are integrated in said tool head;

a manipulator for moving said processing unit together with said fixing unit and said compression unit relative to the loose line bundle in a processing direction along the loose line bundle; said processing unit encompassing the loose line bundle and, for this purpose, selectively having at least two sub-arms, which are movable relative to one another and in a closed state encompass the individual lines, said processing unit having a shape selected from the group consisting of C-shaped and U-shaped; and said fixing unit having at least one nozzle distributed around the loose line bundle, said at least one nozzle being disposed rotatably about the loose line bundle, and said at least one nozzle being movable in a direction toward the loose line bundle.

2. The processing station according to claim 1, wherein a plurality of different fixing agents are provided.

3. The processing station according to claim 1, wherein said processing unit is configured to structure the fixing agent being applied.

4. The processing station according to claim 1, wherein said at least one nozzle is one of a plurality of nozzles, at least one of said nozzles is disposed on each of said sub-arms.

5. The processing station according to claim 1, wherein said processing unit has a curing unit for curing the fixing agent, said curing unit selectively has a UV light source, a gas feed unit, or a heat source.

6. The processing station according to claim 1, wherein said compression unit has a plurality of compression elements formed as rotatably mounted rods, and with an aid of said compression unit the individual lines are compressed.

* * * * *